(12) United States Patent
Machida et al.

(10) Patent No.: US 10,524,388 B2
(45) Date of Patent: Dec. 31, 2019

(54) LOOP HEAT PIPE AND ELECTRONIC DEVICE

(71) Applicant: Shinko Electric Industries Co., LTD., Nagano-Ken (JP)

(72) Inventors: Yoshihiro Machida, Nagano (JP); Nobuyuki Kurashima, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 0 days.

(21) Appl. No.: 16/114,864

(22) Filed: Aug. 28, 2018

(65) Prior Publication Data

US 2019/0090385 A1    Mar. 21, 2019

(30) Foreign Application Priority Data

Sep. 20, 2017   (JP) .................. 2017-180367

(51) Int. Cl.
*H05K 7/20* (2006.01)
*H01L 23/427* (2006.01)
(Continued)

(52) U.S. Cl.
CPC .......... *H05K 7/20336* (2013.01); *B23P 15/26* (2013.01); *F28D 15/0266* (2013.01); *F28D 15/0275* (2013.01); *F28D 15/043* (2013.01); *F28D 15/046* (2013.01); *F28F 3/086* (2013.01); *H01L 23/3736* (2013.01);
(Continued)

(58) Field of Classification Search
CPC ............... H01L 23/473; H01L 21/4882; F28D 15/0266; F28D 15/043; F28D 15/046; F28D 15/0233; F28D 15/0275; F28D 15/06; F28D 15/04; F28D 21/0003; F28D 15/02; F28D 15/0241; F28D 15/025; H05K 7/20336; H05K 7/20809; H05K 7/20309;
(Continued)

(56) References Cited

U.S. PATENT DOCUMENTS

2004/0069460 A1    4/2004  Sasaki et al.
2005/0103477 A1*  5/2005  Kim .................. G06F 1/203
                                                      165/104.33
(Continued)

FOREIGN PATENT DOCUMENTS

EP    3 096 103 A1    11/2016
EP    18192738        12/2018
(Continued)

OTHER PUBLICATIONS

Extended European Search Report for European Application No. 18192738.5, dated Dec. 19, 2018.
(Continued)

*Primary Examiner* — Adam B Dravininkas
(74) *Attorney, Agent, or Firm* — Wolf, Greenfield & Sacks, P.C.

(57) ABSTRACT

A loop heat pipe includes a first heat pipe portion and a second heat pipe portion. The first heat pipe portion includes a first evaporator, a first condenser, a first vapor tube, and a first liquid tube. The second heat pipe portion includes a second evaporator, a second condenser, a second vapor tube, and a second liquid tube. The loop heat pipe further includes a connecting portion that connects the first condenser and the second condenser.

10 Claims, 10 Drawing Sheets

(51) Int. Cl.
    *F28D 15/04*     (2006.01)
    *B23P 15/26*     (2006.01)
    *F28D 15/02*     (2006.01)
    *F28F 3/08*     (2006.01)
    *H01L 23/373*     (2006.01)

(52) U.S. Cl.
    CPC ........ *H01L 23/427* (2013.01); *B23P 2700/09* (2013.01); *F28D 2015/0225* (2013.01); *H01L 23/373* (2013.01)

(58) Field of Classification Search
    CPC ........... H05K 7/20318; H05K 7/20818; H05K 7/20327; H05K 7/20681; H05K 7/20936
    See application file for complete search history.

(56) References Cited

U.S. PATENT DOCUMENTS

| | | | |
|---|---|---|---|
| 2005/0230085 A1* | 10/2005 | Valenzuela | F28D 15/0233 165/104.26 |
| 2006/0272798 A1* | 12/2006 | Liu | H01L 23/427 165/104.33 |
| 2007/0267180 A1* | 11/2007 | Asfia | F28D 15/043 165/104.26 |
| 2008/0037227 A1* | 2/2008 | Fujiwara | G06F 1/203 361/722 |
| 2010/0157534 A1 | 6/2010 | Oniki et al. | |
| 2012/0132402 A1 | 5/2012 | Aoki et al. | |
| 2014/0190738 A1* | 7/2014 | Sakamoto | G06F 1/20 174/548 |
| 2016/0259383 A1 | 9/2016 | Shioga et al. | |
| 2016/0338226 A1* | 11/2016 | Sakamoto | F28D 15/0266 |

FOREIGN PATENT DOCUMENTS

| | | |
|---|---|---|
| EP | 3 428 565 A1 | 1/2019 |
| JP | 2011-027321 A | 2/2011 |
| JP | 2016-021474 A | 2/2016 |
| JP | 2016-090204 A | 5/2016 |

OTHER PUBLICATIONS

Office communication dated Oct. 14, 2019 for European Application No. 18192738.5.

* cited by examiner

LOOP HEAT PIPE AND ELECTRONIC DEVICE

CROSS-REFERENCE TO RELATED APPLICATIONS

This application is based upon and claims the benefit of priority from prior Japanese Patent Application No. 2017-180367, filed on Sep. 20, 2017, the entire contents of which are incorporated herein by reference.

FIELD

The disclosure relates to a loop heat pipe, a method for manufacturing a loop heat pipe, and an electronic device.

BACKGROUND

A heat pipe that changes the phase of a working fluid may be used to cool a heat-generating component such as a semiconductor device, for example, a central processing unit (CPU), mounted on an electronic device (refer to Japanese Laid-Open Patent Publication Nos. 2016-90204 and 2016-21474).

SUMMARY

A high-performance, multi-function electronic device includes a plurality of heat-generating components. In such an electronic component, the heat-generating components may be mounted on the upper and lower surfaces of a wiring substrate. In this case, a heat pipe is provided on each surface of the wiring substrate to cool the mounted heat-generating components. However, the heat pipes may be moved away from the heat-generating components because of the application of an impact or the weight of the heat pipe, especially, when the heat pipe is mounted on the lower surface of the wiring substrate. This may hinder the cooling of the heat-generating components. It is thus required that the heat pipes be kept in position.

One embodiment is a loop heat pipe including a first heat pipe portion and a second heat pipe portion. The first heat pipe portion includes a first evaporator that vaporizes working fluid, a first condenser that liquefies the working fluid vaporized by the first evaporator, a first vapor tube from which the working fluid vaporized by the first evaporator flows into the first condenser, and a first liquid tube from which the working fluid liquefied by the first condenser flows into the first evaporator. The second heat pipe portion includes a second evaporator that vaporizes working fluid, a second condenser that liquefies the working fluid vaporized by the second evaporator, a second vapor tube from which the working fluid vaporized by the second evaporator flows into the second condenser, and a second liquid tube from which the working fluid liquefied by the second condenser flows into the second evaporator. The loop heat pipe further includes a connecting portion that connects the first condenser and the second condenser.

A further embodiment is an electronic device including a first heat-generating component and a second heat generating component that are mounted on a wiring substrate, and a loop heat pipe that cools the first heat-generating component and the second heat-generating component. The first heat-generating component is mounted on an upper surface of the wiring substrate, and the second heat-generating component is mounted on a lower surface of the wiring substrate. Alternatively, the first heat-generating component and the second heat-generating component may be mounted on the upper surface of the wiring substrate. The loop heat pipe includes a first heat pipe portion and a second heat pipe portion. The first heat pipe portion includes a first evaporator that vaporizes working fluid with heat of the first heat-generating component, a first condenser that liquefies the working fluid vaporized by the first evaporator, a first vapor tube from which the working fluid vaporized by the first evaporator flows into the first condenser, and a first liquid tube from which the working fluid liquefied by the first condenser flows into the first evaporator. The second heat pipe portion includes a second evaporator that vaporizes working fluid with heat of the second heat-generating component, a second condenser that liquefies the working fluid vaporized by the second evaporator, a second vapor tube from which the working fluid vaporized by the second evaporator flows into the second condenser, and a second liquid tube from which the working fluid liquefied by the second condenser flows into the second evaporator. The loop heat pipe further includes a connecting portion that connects the first condenser and the second condenser.

Another embodiment is a method for manufacturing a loop heat pipe. The method includes etching each of a plurality of metal layers to pattern and shape the plurality of metal layers into a first evaporator, a first condenser, a first liquid tube, and a first vapor tube of a first heat pipe portion and a second evaporator, a second condenser, a second liquid tube, and a second vapor tube of a second heat pipe portion. The method further includes stacking the plurality of metal layers to form the first heat pipe portion, the second heat pipe portion, and a connecting portion that connects the first condenser and the second condenser.

Other embodiments and advantages thereof will become apparent from the following description, taken in conjunction with the accompanying drawings, illustrating by way of example the principles of the invention. It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
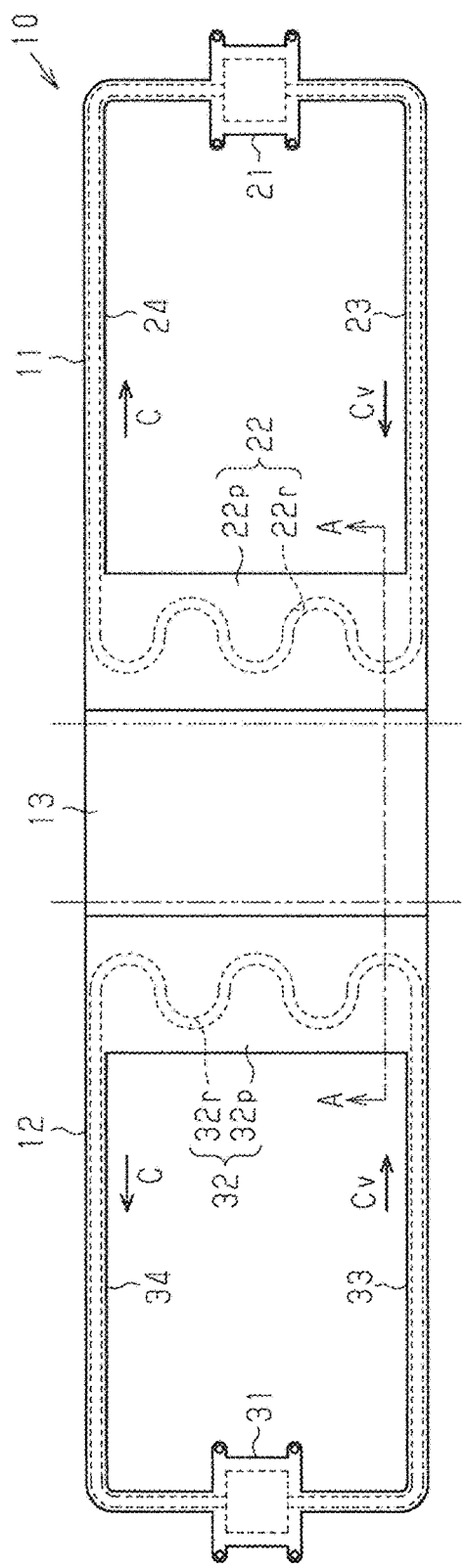
FIG. 1A is a schematic plan view illustrating one embodiment of a loop heat pipe.

In the drawings, elements are illustrated for simplicity and clarity and have not necessarily been drawn to scale. To facilitate understanding, hatching lines may not be illustrated or be replaced by shadings in the cross-sectional drawings.

One embodiment of a loop heat pipe 10 will now be described.

Figure 1B:
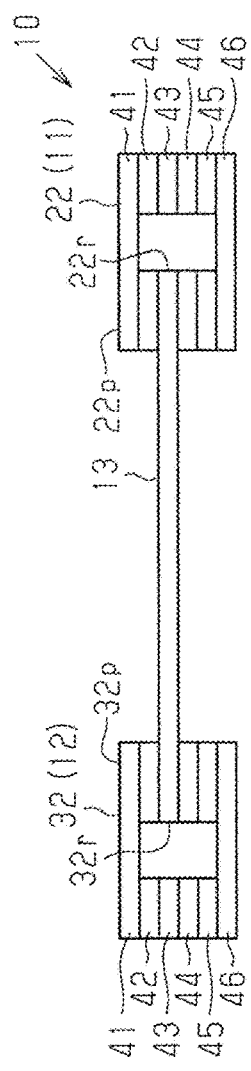
FIG. 1B is a cross-sectional view taken along line A-A in FIG. 1A illustrating a connecting portion connecting a first condenser and a second condenser.
Figure 2:
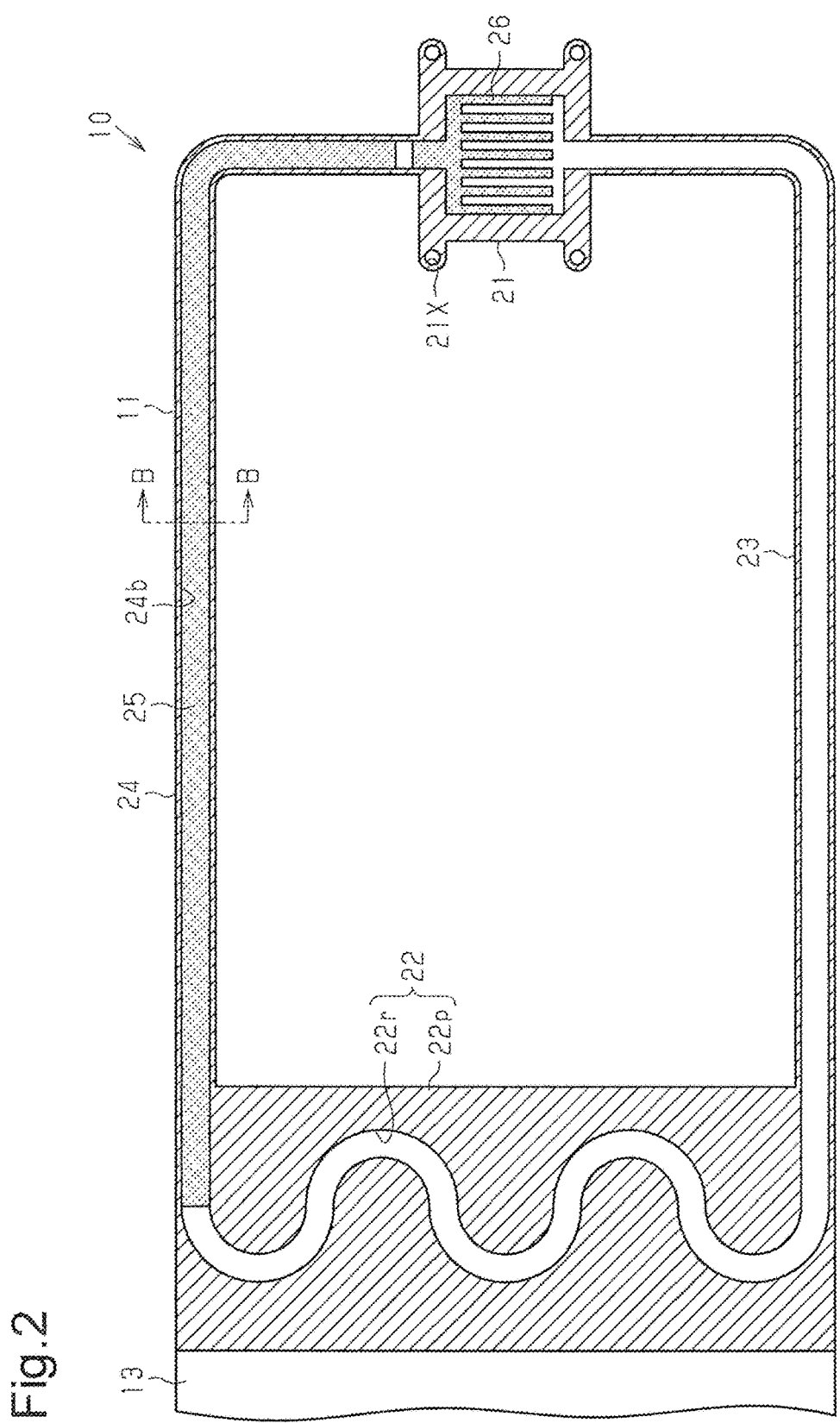
FIG. 2 is a schematic cross-sectional view illustrating a first heat pipe portion in the loop heat pipe of FIG. 1A.

FIG. 1A is a schematic plan view illustrating the loop heat pipe 10 (hereinafter, simply referred to as the heat pipe 10). The heat pipe 10 includes a first heat pipe portion 11, a second heat pipe portion 12, and a connecting portion 13. The first heat pipe portion 11 includes an evaporator 21, a condenser 22, a vapor tube 23, and a liquid tube 24. In the same manner, the second heat pipe portion 12 includes an evaporator 31, a condenser 32, a vapor tube 33, and a liquid tube 34. FIG. 1B is a cross-sectional view taken along line A-A in FIG. 1A illustrating the condenser 22, the condenser 32, and the connecting portion 13 between the condensers 22 and 32. FIG. 2 is a schematic plan view illustrating the first heat pipe portion 11. Among metal layers 41 to 46, which will be described layer with reference to FIG. 1B, the metal layer 41 is removed from the first heat pipe portion 11 illustrated in FIG. 2.

With reference to FIG. 1A, the heat pipe 10 has the form of a flat plate. As illustrated in FIGS. 1A and 2, in the first heat pipe portion 11, the vapor tube 23 connects an outlet of the evaporator 21 and an inlet of the condenser 22. The liquid tube 24 connects an outlet of the condenser 22 and an inlet of the evaporator 21. Accordingly, the evaporator 21, the vapor tube 23, the condenser 22, and the liquid tube 24 form a looped passage in the first heat pipe portion 11. Working fluid C flows through the looped passage. In the present embodiment, the liquid tube 24 and the vapor tube 23 have, for example, the same length. However, the length of the liquid tube 24 may differ from the length of the vapor tube 23. For example, the vapor tube 23 may be shorter than the liquid tube 24.

The condenser 22 includes a heat dissipation plate 22p and a passage 22r. The heat dissipation plate 22p has a relatively large area to dissipate heat. The passage 22r meanders through the inner side of the heat dissipation plate 22p.

Figure 3:
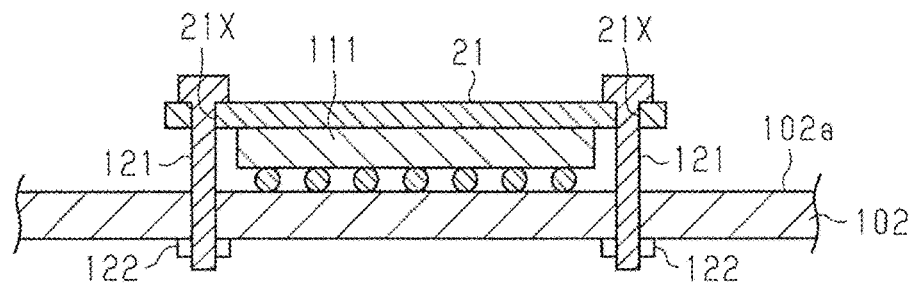
FIG. 3 is a schematic cross-sectional view illustrating the construction of an evaporator (e.g., first evaporator) in the loop heat pipe of FIG. 1A.

Referring to FIG. 3, the evaporator 21 is fixed to an upper surface of a heat-generating component 111 that is mounted on a wiring substrate 102. For example, the evaporator 21 includes coupling holes 21X. Screws 121 are inserted through the coupling holes 21X and the wiring substrate 102. Then, nuts 122 are fastened to the screws 121 to fix the evaporator 21 to the wiring substrate 102. The evaporator 21 is in contact with the upper surface of the heat-generating component 111. Thermal interface material (TIM) may be arranged between the evaporator 21 and the heat-generating component 111. The thermal interface material reduces thermal contact resistance between the heat-generating component 111 and the evaporator 21 and smoothly conducts heat from the heat-generating component 111 to the evaporator 21.

The evaporator 21 vaporizes the working fluid C. That is, in the evaporator 21, the heat of the heat-generating component 111 generates vapor Cv from the working fluid C (refer to FIG. 1A). The vapor Cv is drawn through the vapor tube 23 to the condenser 22 and liquefied by the condenser 22. Accordingly, in the first heat pipe portion 11, the heat generated by heat-generating component 111 (refer to FIG. 3) is moved from the evaporator 21 via the vapor tube 23 to the condenser 22 and dissipated by the condenser 22. The first heat pipe portion 11 cools the heat-generating component 111.

Preferably, the working fluid C that is used has a high vapor pressure and a large latent heat of vaporization. By using such a working fluid C, the heat-generating component 111 is efficiently cooled by the latent heat of vaporization. The working fluid C may be, for example, ammonia, water, chlorofluorocarbon, alcohol, acetone, or the like.

As illustrated in FIG. 1A, in the second heat pipe portion 12, the vapor tube 33 connects an outlet of the evaporator 31 and an inlet of the condenser 32. The liquid tube 34 connects an outlet of the condenser 32 and an inlet of the evaporator 31. Accordingly, the evaporator 31, the vapor tube 33, the condenser 32, and the liquid tube 34 form a looped passage in the second heat pipe portion 12. The working fluid C flows through the looped passage. In the present embodiment, the liquid tube 34 and the vapor tube 33 have, for example, the same length. However, the length of the liquid tube 34 may differ from the length of the vapor tube 33. For example, the vapor tube 33 may be shorter than the liquid tube 34.

The condenser 32 includes a heat dissipation plate 32p and a passage 32r. The heat dissipation plate 32p has a relatively large area to dissipate heat. The passage 32r meanders through the inner side of the heat dissipation plate 32p.

Although not illustrated in detail, the evaporator 31 is constructed in the same manner as the evaporator 21 and fixed to a heat-generating component 112 (refer to FIG. 6) by a structure similar to that illustrated in FIG. 3. In the second heat pipe portion 12, in the same manner as the first heat pipe portion 11, the heat generated by the heat-generating component 112 (refer to FIG. 6) is moved from the evaporator 31 via the vapor tube 33 to the condenser 32 and dissipated by the condenser 32. Thus, the second heat pipe portion 12 cools the heat-generating component 112. The working fluid C may be the same as that used in the first heat pipe portion 11.

As illustrated in FIGS. 1A and 1B, the connecting portion 13 connects the condenser 22 of the first heat pipe portion 11 and the condenser 32 of the second heat pipe portion 12. The connecting portion 13 is bendable and bent at, for example, positions corresponding to the double-dashed lines illustrated in FIG. 1A.

The connecting portion 13 is formed integrally with the condenser 22 of the first heat pipe portion 11 and the condenser 32 of the second heat pipe portion 12. Thus, the connecting portion 13 is adjacent to the condensers 22 and 32. In the present example, the connecting portion 13 is formed integrally with a pipe wall of the passage 22r in the condenser 22 and a pipe wall of the passage 32r in the condenser 32.

The heat pipe 10 includes a plurality of (six in the present embodiment) stacked metal layers, namely, the metal layers 41 to 46. That is, the first heat pipe portion 11 and the second heat pipe portion 12 are formed by stacking the six metal layers 41 to 46. The connecting portion 13 is formed by at least one of the metal layers 41 to 46. As illustrated in FIG. 1B, in the present embodiment, for example, the connecting portion 13 is formed by the metal layer 43.

In the heat pipe 10 (first heat pipe portion 11 and second heat pipe portion 12), the number of metal layers is not limited to six and may be five or less or seven or greater. In the present embodiment, the single metal layer 43 is used to form the connecting portion 13. However, two or more of the metal layers 41 to 46 may be used to form the connecting portion 13. The number of metal layers forming the first heat pipe portion 11 may differ from the number of metal layers forming the second heat pipe portion 12.

In the present embodiment, the metal layer 41 is the uppermost metal layer including the upper surface of the first heat pipe portion 11 and the upper surface of the second heat pipe portion 12. The metal layer 46 is the lowermost metal layer including the lower surface of the first heat pipe portion 11 and the lower surface of the second heat pipe portion 12. Each of the metal layers 42 to 45 may be referred to as an intermediate metal layer located between the uppermost metal layer 41 and the lowermost metal layer 46. The present embodiment includes the four intermediate metal layers 42 to 45 but only needs to include at least one intermediate metal layer between the uppermost metal layer 41 and the lowermost metal layer 46. Further, in the present embodiment, the single intermediate metal layer 43 is used to form the connecting portion 13. However, two or more of the metal layers 42 to 45 may be used to form the connecting portion 13. The connecting portion 13 may be rigidly supported by forming the connecting portion 13 with one or more intermediate metal layers. Alternatively, the uppermost metal layer 41 or the lowermost metal layer 46 may be used to form the connecting portion 13.

The metal layers 41 to 46 may be formed from, for example, a material having high thermal conductance. Examples of such a material include copper, copper alloy, aluminum, aluminum allow, stainless steel, magnesium alloy, and the like.

In the present embodiment, copper, which has superior heat conductivity, is used as the material of the metal layers 41 to 46. The metal layers 41 to 46 may be bonded to one another in a stacking direction (vertical direction as viewed in FIG. 1B). The metal layers 41 to 46 may be bonded through solid-phase bonding such as diffusion bonding, thermocompression bonding, or the like. The metal layers 41 to 46 may each have a thickness of, for example, 100 μm to 300 μm. One or more of the metal layers 41 to 46 may be formed from a material that differs from that of the other metal layers.

The construction of the first heat pipe portion 11 will now be described in detail. The second heat pipe portion 12 has the same construction as the first heat pipe portion 11 and thus will neither be described below nor illustrated in the drawings.

As illustrated in FIG. 2, the liquid tube 24 includes a porous body 25. The porous body 25 extends along the liquid tube 24 to the vicinity of the evaporator 21.

Figure 4:
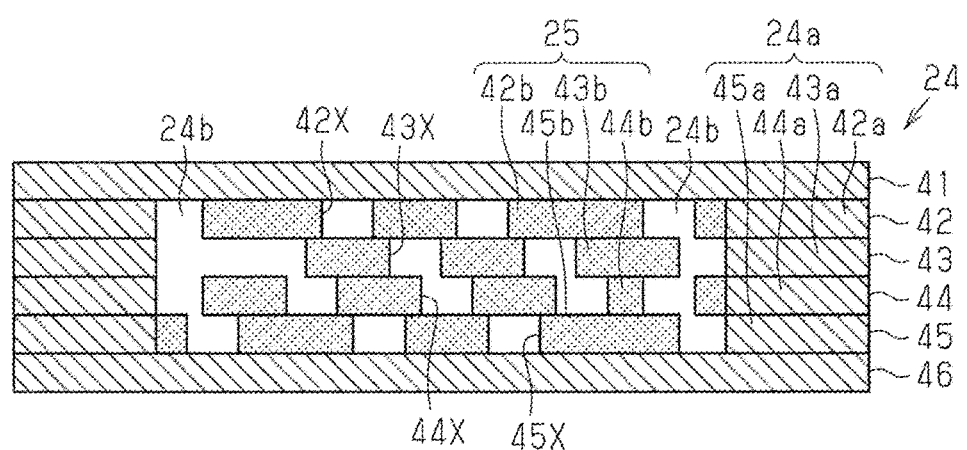
FIG. 4 is a cross-sectional view taken along line B-B in FIG. 2 illustrating a liquid tube (e.g., first liquid tube) in the loop heat pipe of FIG. 1A.

FIG. 4 is a cross-sectional view taken along line B-B in FIG. 2. As illustrated in FIG. 4, the porous body 25 of the liquid tube 24 is formed by the four metal layers 42 to 45 that do not include the uppermost metal layer 41 and the lowermost metal layer 46 among the six metal layers 41 to 46. In FIG. 4, the portions of the metal layers 42 to 45 forming the porous body 25 are shaded in correspondence with the porous body 25 illustrated in FIG. 2.

FIG. 4 uses solid lines to illustrate each of the metal layers 41 to 46. However, when the metal layers 41 to 46 are integrated through diffusion bonding as described above, interfaces are eliminated between the metal layers 41 to 46, and the boundaries between the metal layers 41 to 46 are not clear.

The metal layers 42, 43, 44, and 45 respectively include wall portions 42a, 43a, 44a, and 45a, which form a pipe wall 24a of the liquid tube 24, and porous portions 42b, 43b, 44b, and 45b, which form the porous body 25 and are located at the inner side of the wall portions 42a, 43a, 44a, and 45a. The porous body 25 (i.e., stacked porous portions 42b, 43b, 44b, and 45b) includes through holes 42X, 43X, 44X, and 45X. The through holes 42X, 43X, 44X, and 45X form fine passages 24b through which the working fluid C flows. In this manner, the porous body 25 forms the passages 24b to produce capillary force that acts to smoothly move the working fluid C through the liquid tube 24.

The through holes 42X to 45X are each circular in a plan view. Further, the through holes 42X to 45X are laid out to be partially overlapped with the through holes 42X to 45X of the vertically adjacent metal layers 42 to 45.

As illustrated in FIG. 2, the evaporator 21 includes a porous body 26. The porous body 26 may be constructed in the same manner as the porous body 25 of the liquid tube 24. As described above with reference to FIG. 3, the evaporator 21 includes the plurality of (for example, four in FIG. 2) coupling holes 21X. The coupling holes 21X allow the evaporator 21 to be fixed to the wiring substrate 102.

Figure 5A:
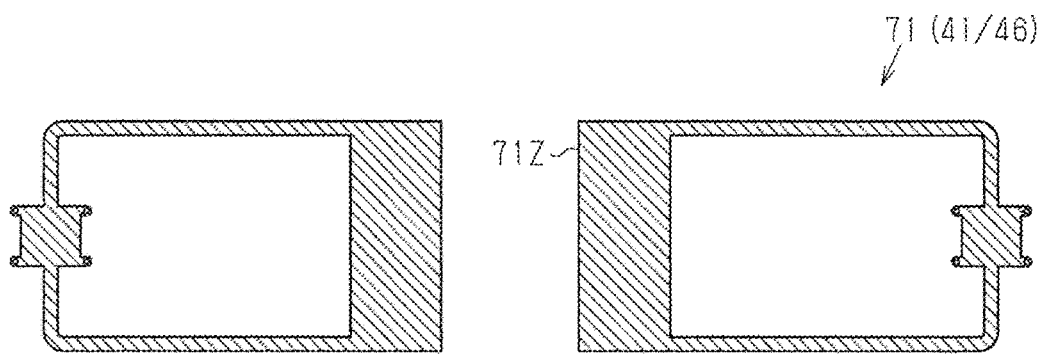
FIG. 5A is a schematic plan view illustrating an outermost (uppermost/lowermost) one of metal layers forming the loop heat pipe of FIG. 1A.
Figure 5B:
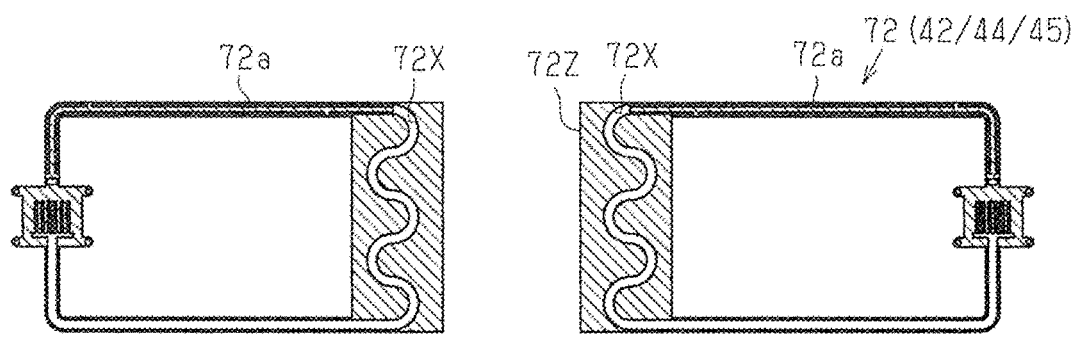
FIG. 5B is a schematic plan view illustrating an intermediate metal layer of the loop heat pipe of FIG. 1A.
Figure 5C:
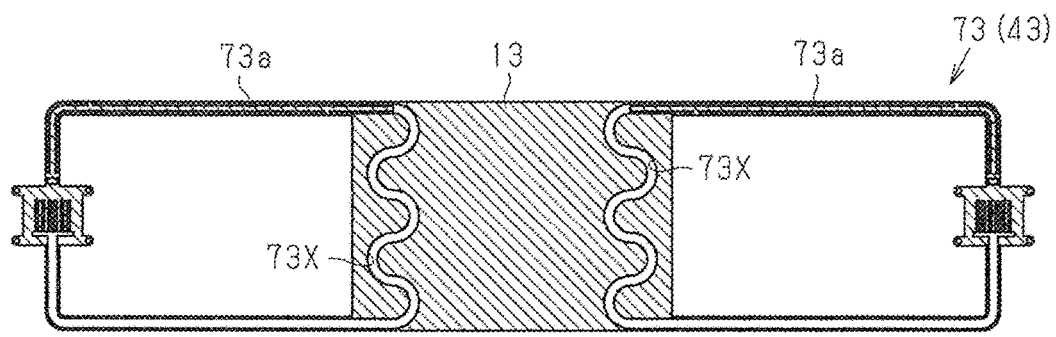
FIG. 5C is a schematic plan view illustrating another intermediate metal layer of the loop heat pipe of FIG. 1A.

A method for manufacturing the heat pipe 10 will now be described. FIGS. 5A to 5C are plan views illustrating metal layers used to form the heat pipe 10.

FIG. 5A is a plan view of a metal layer 71 used as the uppermost one or lowermost one of the metal layers 41 to 46 forming the heat pipe 10 (refer to FIG. 1B). That is, the metal layer 71 is used as the uppermost metal layer 41 and also used as the lowermost metal layer 46 (refer to FIG. 1B). The metal layer 71 is patterned in correspondence with the shapes of the first and second heat pipe portions 11 and 12 illustrated in FIG. 1A. Although not illustrated in the drawings, the metal layer 71 is fixed to a frame by, for example, a bridge (connecting member).

FIG. 5B is a plan view of a metal layer 72 used as an intermediate metal layer that does not include the connecting portion 13 among the metal layers 41 to 46 (refer to FIG. 1B). That is, the metal layer 72 is used as one of the metal layers 42, 44, and 45. The metal layer 72 is patterned in correspondence with the shapes of the first and second heat pipe portions 11 and 12.

FIG. 5C is a plan view of a metal layer 73 used as the metal layer 43 forming the connecting portion 13 among the metal layers 41 to 46 (refer to FIG. 1B). The metal layer 73 is patterned in correspondence with the shape of the first and second heat pipe portions 11 and 12 and the connecting portion 13.

The metal layers 71 to 73 of FIGS. 5A to 5C are each formed by performing, for example, wet etching on a copper layer having a thickness of, for example, 100 μm to pattern the copper layer into a given shape.

The metal layer 71 of FIG. 5A includes an opening 71Z that defines the condenser 22 of the first heat pipe portion 11 and the condenser 32 of the second heat pipe portion 12.

The metal layer 72 of FIG. 5B includes openings 72X that correspond to a passage extending through the evaporator 21, the condenser 22, the vapor tube 23, and the liquid tube 24 of the first heat pipe portion 11 and a passage extending through the evaporator 31, the condenser 32, the vapor tube 33, and the liquid tube 34 of the second heat pipe portion 12. Further, the metal layer 72 includes an opening 72Z that defines the condenser 22 of the first heat pipe portion 11 and the condenser 32 of the second heat pipe portion 12. In addition, the metal layer 72 includes porous portions 72a corresponding to the liquid tubes 24 and 34. The porous portions 72a include the through holes 42X, 44X, and 45X of the porous body 25 (refer to FIG. 4).

In the same manner as the metal layer 72 of FIG. 5B, the metal layer 73 of FIG. 5C includes openings 73X corresponding to a passage extending through the evaporator 21, the condenser 22, the vapor tube 23, and the liquid tube 24 of the first heat pipe portion 11 and a passage extending through the evaporator 31, the condenser 32, the vapor tube 33, and the liquid tube 34 of the second heat pipe portion 12. Further, the metal layer 73 includes porous portions 73a corresponding to the liquid tubes 24 and 34. The porous portions 73a include the through holes 43X of the porous body 25 (refer to FIG. 4).

Further, the metal layer 73 includes the connecting portion 13 that is formed integrally with the heat dissipation plates 22p and 32p of the condensers 22 and 32 in the first and second heat pipe portions 11 and 12 (refer to FIG. 1A). Accordingly, the metal layer 73 does not include an opening that separates the condensers 22 and 32 like the opening 71Z of the metal layer 71 and the opening 72Z of the metal layer 72.

An inlet (not illustrated) for the working fluid C is arranged at a given position in the metal layers 71 to 73, for example, at a portion corresponding the liquid tubes 24 and 34 illustrated in FIG. 1A.

Then, the two metal layers 71, which are formed as the metal layers 41 and 46, are arranged at the uppermost and lowermost locations. The three metal layers 72, which are formed as the metal layers 42, 44, and 45, and the metal layer 73, which is formed as the metal layer 43, are arranged between the two metal layers 71.

Further, diffusion bonding is performed to bond the metal layers 71, 72, and 73 by pressing and heating the stacked metal layers 71, 72, and 73 to a given temperature (e.g., approximately 900° C.). Subsequently, a vacuum pump (not illustrated) is used to discharge air from the liquid tubes 24 and 34, which are then filled with the working fluid C (e.g., water) through the inlet (not illustrated). Then, the inlet is closed.

A mounting example of the loop heat pipe 10 in accordance with the present embodiment will now be described with reference to FIGS. 1A and 6.

Figure 6:
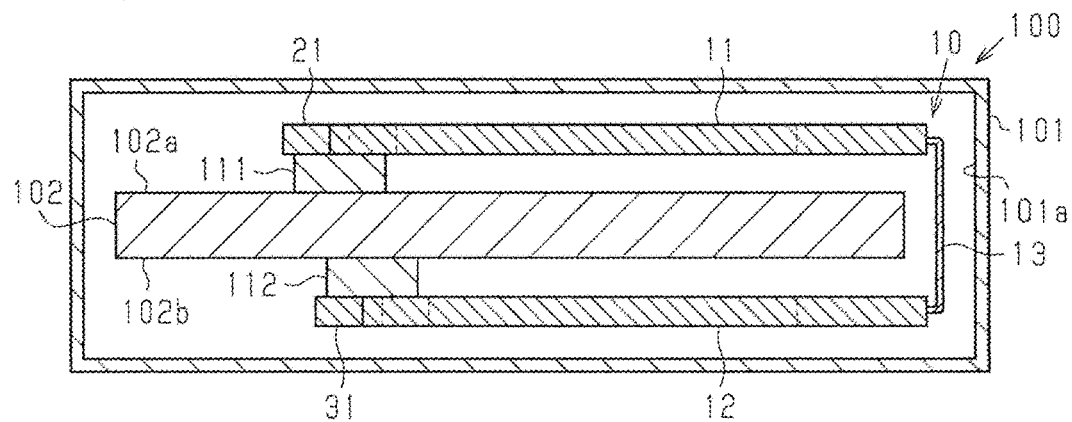
FIG. 6 is a schematic cross-sectional view illustrating an electronic device including the loop heat pipe of FIG. 1A.

The heat pipe 10 is used in an electronic device 100 illustrated in FIG. 6.

As illustrated in FIG. 6, the electronic device 100 includes the first heat-generating component 111 mounted on an upper surface 102a of the wiring substrate 102, the second heat-generating component 112 mounted on a lower surface 102b of the wiring substrate 102, and the heat pipe 10. The electronic device 100 includes a housing 101 that accommodates the first and second heat-generating components 111 and 112 and the heat pipe 10. The electronic device 100 is a thin device such as a smartphone or a tablet.

A support (not illustrated) supports the wiring substrate 102 at a location spaced apart from an inner surface 101a of the housing 101. Each of the first and second heat-generating components 111 and 112 is, for example, a semiconductor device such as a central processing unit (CPU) or a graphics processing unit (GPU).

The heat pipe 10 includes the first heat pipe portion 11, the second heat pipe portion 12, and the connecting portion 13. The first heat pipe portion 11 is arranged parallel to the upper surface 102a at the upper side of the wiring substrate 102. The second heat pipe portion 12 is arranged parallel to the lower surface 102b at the lower side of the wiring substrate 102. The first heat pipe portion 11 cools the first heat-generating component 111, which is mounted on the upper surface 102a of the wiring substrate 102. The second heat pipe portion 12 cools the second heat-generating component 112, which is mounted on the lower surface 102b of the wiring substrate 102.

The connecting portion 13 connects the first heat pipe portion 11 and the second heat pipe portion 12. Further, the connecting portion 13 holds the first heat pipe portion 11 and the second heat pipe portion 12 parallel to each other. The connecting portion 13 is bendable. The connecting portion 13 is bent at given bending positions so that the first heat pipe portion 11 and the second heat pipe portion 12 extend parallel to each other. The evaporator 21 is fixed to the upper surface of the first heat-generating component 111, and the evaporator 31 is fixed to the lower surface of the second heat-generating component 112.

The second heat pipe portion 12 is held by the connecting portion 13, which connects the first and second heat pipe portions 11 and 12. The second heat pipe portion 12, which is located at the lower side of the wiring substrate 102, is held in place without being fixed to, for example, the housing 101 or the like. That is, the second heat pipe portion 12 is kept in position.

In this manner, the connecting portion 13 keeps the second heat pipe portion 12 in position. Thus, there is no need to fix the second heat pipe portion 12 to, for example, the wiring substrate 102 or the housing 101. This improves the degree of design freedom for the wiring substrate 102 and the housing 101. That is, the degree of design freedom for the electronic device 100 is improved. Further, there is no need for a member used to fix the second heat pipe portion 12. This reduces the weight of the electronic device 100.

The present embodiment has the advantages described below.

(1-1) The heat pipe 10 includes the first heat pipe portion 11, the second heat pipe portion 12, and the connecting portion 13, which connects the first heat pipe portion 11 and the second heat pipe portion 12. The first heat pipe portion 11 includes the evaporator 21, the condenser 22, the vapor tube 23, and the liquid tube 24. The second heat pipe portion 12 includes the evaporator 31, the condenser 32, the vapor tube 33, and the liquid tube 34. The connecting portion 13 is bendable. The first heat pipe portion 11 is located at the upper side of the wiring substrate 102, and the second heat pipe portion 12 is located at the lower side of the wiring substrate 102. The second heat pipe portion 12 is held by the connecting portion 13, which connects the first and second heat pipe portions 11 and 12. Thus, the second heat pipe portion 12, which is located at the lower side of the wiring substrate 102, is kept in position without being fixed to, for example, the housing 101 or the like.

(1-2) The first heat pipe portion 11 and the second heat pipe portion 12 are formed by stacking the metal layers 41 to 46. The connecting portion 13 is formed by at least one of the metal layers 41 to 46 (metal layer 43 in present embodiment). Thus, the first heat pipe portion 11 and the second heat pipe portion 12 are easily connected. Further, in comparison with when using a separate connecting portion, the formation of the loop heat pipe 10, which includes the first heat pipe portion 11 and the second heat pipe portion 12, is facilitated. In particular, the formation of the connecting portion 13 with the single metal layer 43 facilitates the bending of the connecting portion 13.

(1-3) The connecting portion 13 connects the condenser 22 of the first heat pipe portion 11 and the condenser 32 of the second heat pipe portion 12. Further, the connecting portion 13 is formed by at least one of the metal layers 41 to 46 (metal layer 43 in present embodiment) of the first heat pipe portion 11 and the second heat pipe portion 12. Accordingly, the heat of the condensers 22 and 32 is dissipated from the condensers 22 and 32 and also transferred to and dissipated from the connecting portion 13. As a result, the connecting portion 13 greatly increases the surface area of the portion from where the heat pipe 10 dissipates heat as compared with when dissipating heat from only the two separate condensers 22 and 32 (i.e., two physically separated condensers that are not connected by the connecting portion). This improves the heat dissipation efficiency of the condensers 22 and 32 and allows the first heat pipe portion 11 and the second heat pipe portion 12 to efficiently cool the first heat-generating component 111 and the second heat-generating component 112.

It should be apparent to those skilled in the art that the foregoing embodiments may be implemented in many other specific forms without departing from the scope of this disclosure. Particularly, it should be understood that the foregoing embodiments may be implemented in the following forms.

The heat pipe 10 of the above embodiment may be changed in shape.

Figure 7:
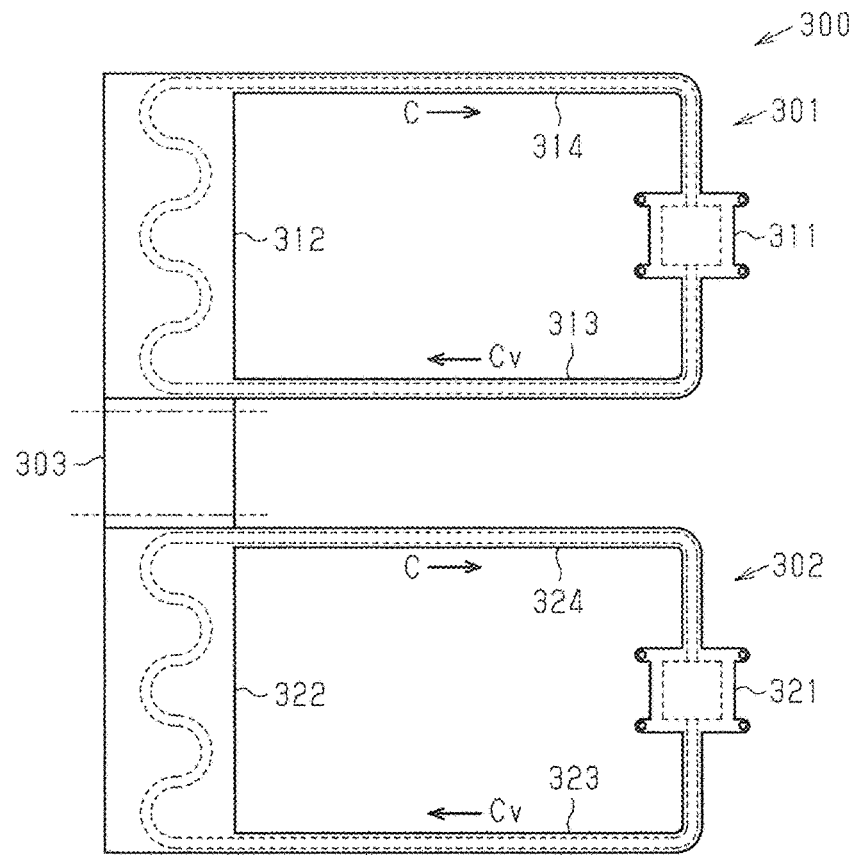
FIG. 7 is a schematic plan view illustrating a modified example of the loop heat pipe.

FIG. 7 illustrates a modified example of a loop heat pipe 300. The heat pipe 300 includes a first heat pipe portion 301, a second heat pipe portion 302, and a connecting portion 303. The first heat pipe portion 301 includes an evaporator 311, a condenser 312, a vapor tube 313, and a liquid tube 314. The vapor tube 313 and the liquid tube 314 connect the evaporator 311 and the condenser 312. In the same manner, the second heat pipe portion 302 includes an evaporator 321, a condenser 322, a vapor tube 323, and liquid tube 324. The vapor tube 323 and the liquid tube 324 connect the evaporator 321 and the condenser 322. The connecting portion 303 connects the condenser 312 of the first heat pipe portion 301 and the condenser 322 of the second heat pipe portion 302.

In the heat pipe 300, the connecting portion 303 is connected to the condensers 312 and 322 so that the connecting portion 303 is bent along axes parallel to the vapor tube 313 and the liquid tube 314 of the first heat pipe portion 301 and the vapor tube 323 and the liquid tube 324 of the second heat pipe portion 302. In the heat pipe 300, the connecting portion 303 is bent at positions illustrated by the double-dashed lines in FIG. 7 so that the first heat pipe portion 301 and the second heat pipe portion 302 are parallel to each other. Further, in the same manner as the embodiment described above, the first heat pipe portion 301 and the second heat pipe portion 302 are respectively arranged at the upper side and lower side of the wiring substrate 102 illustrated in FIG. 6 to cool the first heat-generating component 111 on the upper surface 102a of the wiring substrate 102 and the second heat-generating component 112 on the lower surface 102b of the wiring substrate 102. The first heat pipe portion 301 and the second heat pipe portion 302 are connected by the connecting portion 303. Thus, the second heat pipe portion 302 located at the lower side of the wiring substrate 102 is held by the connecting portion 303, which is connected to the first heat pipe portion 301 located at the upper side of the wiring substrate 102. This keeps the second heat pipe portion 302 in position.

Figure 8:
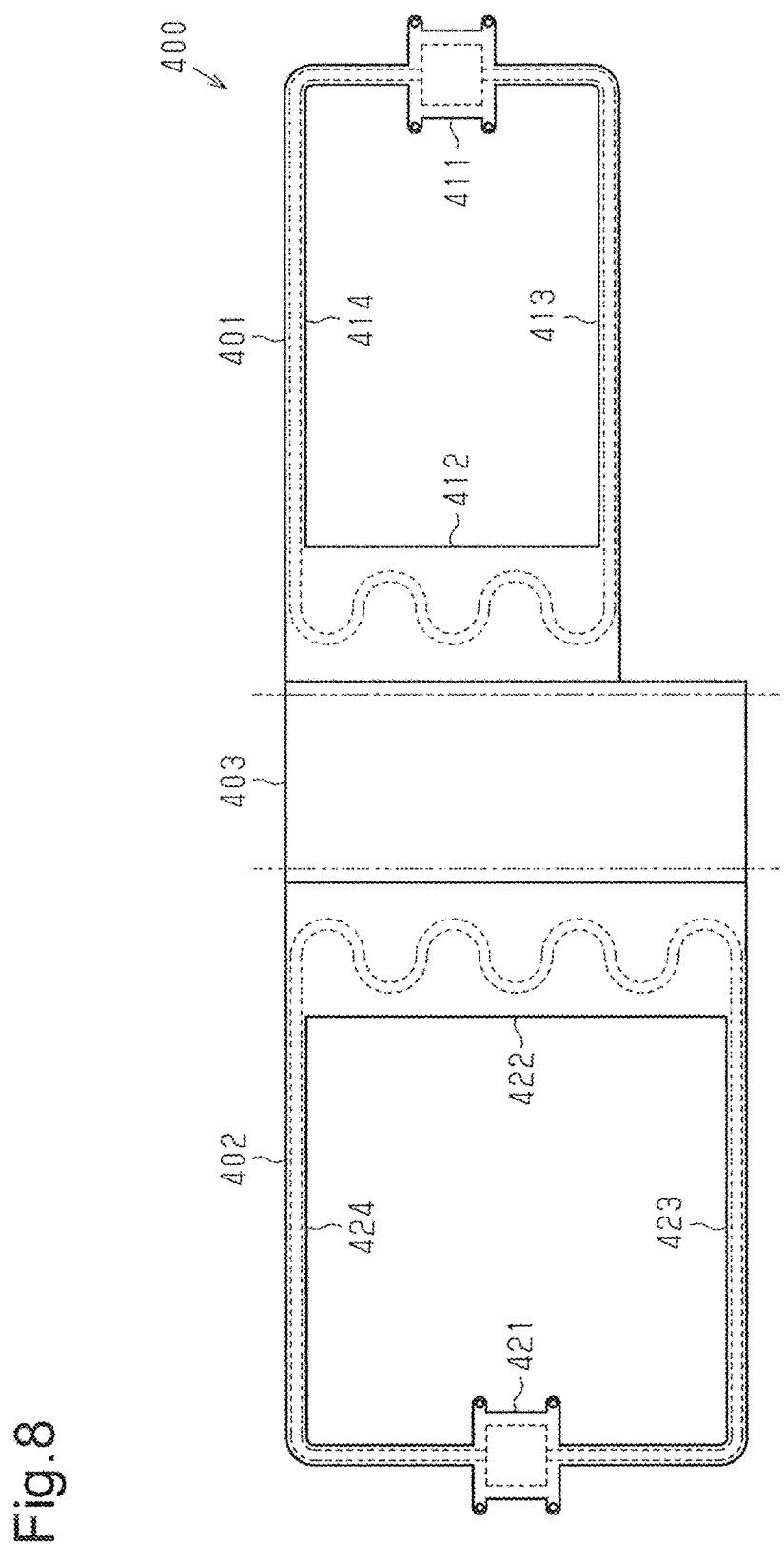
FIG. 8 is a schematic plan view illustrating a further modified example of the loop heat pipe.

FIG. 8 illustrates a further modified example of a loop heat pipe 400. The heat pipe 400 includes a first heat pipe portion 401, a second heat pipe portion 402, and a connecting portion 403. The first heat pipe portion 401 includes an evaporator 411, a condenser 412, a vapor tube 413, and a liquid tube 414. The vapor tube 413 and the liquid tube 414 connect the evaporator 411 and the condenser 412. In the same manner, the second heat pipe portion 402 includes an evaporator 421, a condenser 422, a vapor tube 423, and a liquid tube 424. The vapor tube 423 and the liquid tube 424 connect the evaporator 421 and the condenser 422.

In the heat pipe 400, the condenser 412 of the first heat pipe portion 401 and the condenser 422 of the second heat pipe portion 402 have different lengths in a direction extending along the bending axes of the connecting portion 403 (vertical direction as viewed in FIG. 8). The length of the first heat pipe portion 401 and the length of the second heat pipe portion 402 are set in accordance with the position and heat generation amount of the corresponding heat-generating component. This construction improves the degree of freedom for the position where a heat-generating component is mounted in a wiring substrate. That is, the degree of design freedom for the wiring substrate is improved.

Figure 9:
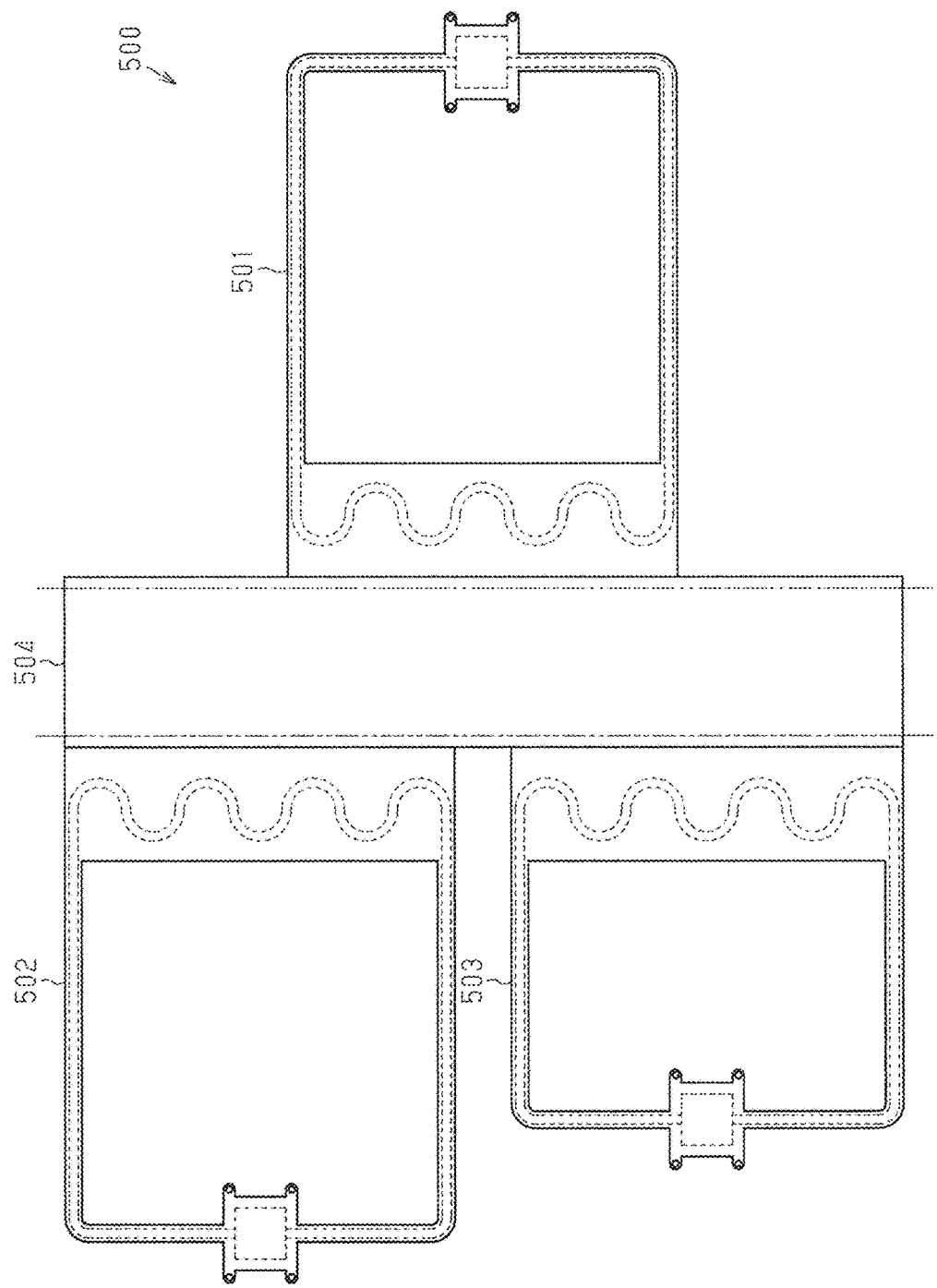
FIG. 9 is a schematic plan view illustrating another modified example of the loop heat pipe.

FIG. 9 illustrates another modified example of a loop heat pipe 500. The heat pipe 500 includes three heat pipe portions 501, 502, and 503 that are connected to one another by a connecting portion 504. Even in the heat pipe 500, which includes the three heat pipe portions 501, 502, and 503, the heat pipe portions 501, 502, and 503 properly cool three heat-generating components while kept in position.

The connecting portion 13 of the above embodiment (or connecting portion of each modified example) and its periphery may be changed in shape.

Figure 10A:
FIG. 10A is a schematic cross-sectional view illustrating a loop heat pipe including a modified example of the connecting portion.

FIG. 10A illustrates a modified example of a connecting portion 601. The connecting portion 601 includes an upper surface 601a and two grooves 602. The grooves 602a are formed along the double-dashed lines in FIG. 1A. In this manner, the formation of the grooves 602 in the connecting portion 601 facilitates bending of the loop heat pipe (connecting portion 601).

Figure 10B:
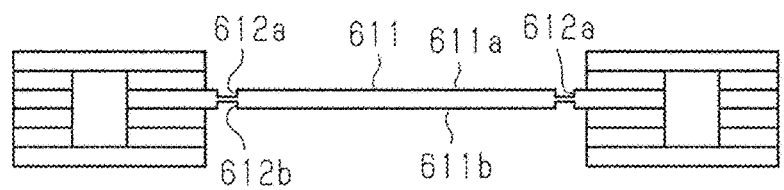
FIG. 10B is a schematic cross-sectional view illustrating a loop heat pipe including a further modified example of the connecting portion.

FIG. 10B illustrates a further modified example of a connecting portion 611. The connecting portion 611 has an upper surface 611a including two grooves 612a and a lower surface 611b including two grooves 612b. The grooves 612b are formed at positions corresponding to the grooves 612a. The formation of the grooves 612a and 612b in the upper surface 611a and lower surface 611b of the connecting portion 611 facilitates bending of the loop heat pipe (connecting portion 611) toward both upper and lower sides.

The grooves 602, 612a, and 612b may be formed in correspondence with the bending positions of the connecting portions 601 and 611. In FIGS. 10A and 10B, the grooves 602, 612a, and 612b are formed at the ends of the connecting portions 601 and 611. However, a groove may be formed in, for example, a middle part of the connecting portion 601, 611. That is, the loop heat pipe may be bent at one location in the connecting portion 601, 611.

A groove may be formed at a position other than the bending position. Further, a groove may be formed at a given angle relative to a bending position (double-dashed lines in FIG. 1A). Further, a plurality of intersecting grooves may be formed. Such grooves increase the surface area of the connecting portion. This increases the surface area of the portion where heat is dissipated from the heat pipe and increases heat dissipation.

The metal layers 41 to 46 of the above embodiment may be changed in shape.

Figure 11:
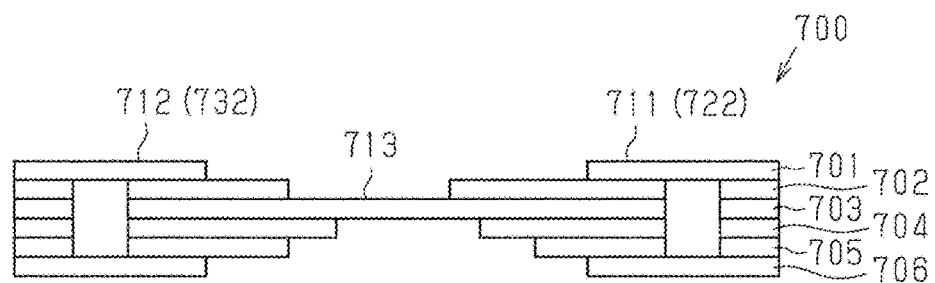
FIG. 11 is a schematic cross-sectional view illustrating a loop heat pipe including a modified example of the metal layer.

FIG. 11 illustrates a loop heat pipe 700 including a modified example of metal layers 701 to 706. The heat pipe 700 is formed by stacking the metal layers 701 to 706. The metal layer 703 forms the connecting portion 713. The metal layer 702 located at the upper side of the metal layer 703 extends toward the middle part of the connecting portion 713. The metal layers 704 and 705 located at the lower side of the metal layer 703 also extend toward the middle part of the connecting portion 713. This increases the surface area of a condenser 722 of a first heat pipe portion 711 and the surface area of a condenser 732 of a second heat pipe portion 712. Thus, heat dissipation is increased. The extended metal layers may be provided at any location, in any number, and/or with any length to obtain the desired surface area.

The connecting portion 13 of the above embodiment (or connecting portion of each modified example) may be connected to a joining member or a heat conductance member.

Figure 12A:
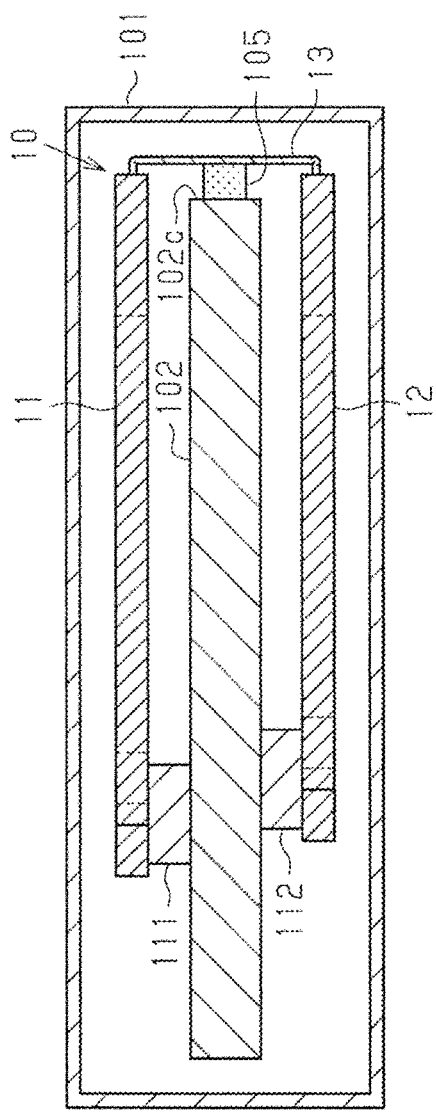
FIGS. 12A, 12B, and 13 are schematic cross-sectional views illustrating electronic devices including modified examples of the loop heat pipe.

For example, as illustrated in FIG. 12A, the connecting portion 13 may be fixed to a side surface 102c of the wiring substrate 102 by a joining member 105. For example, an adhesive may be used as the joining member 105. The joining member 105 fixes the connecting portion 13 to the wiring substrate 102. This further ensures that the heat pipe 10 is kept in position.

Figure 12B:
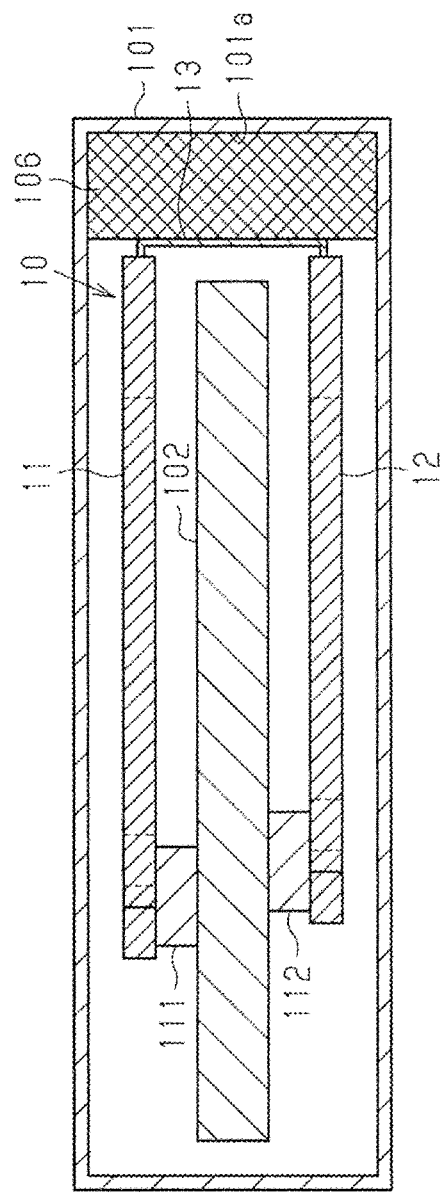

Alternatively, as illustrated in FIG. 12B, a heat sink 106 may be coupled to the connecting portion 13 and the inner surface 101a of the housing 101. The heat sink 106 transfers heat from the connecting portion 13 (heat dissipation portion) to the housing 101. Thus, heat is efficiently dissipated from the connecting portion 13 and out of the housing 101. Although not illustrated, thermal interface material (TIM) may be arranged between the heat sink 106 and the connecting portion 13. In this construction, heat is smoothly conducted from the connecting portion 13 to the heat sink 106. Further, thermal interface material (TIM) may be arranged between the heat sink 106 and the housing 101. In this construction, heat is smoothly conducted from the heat sink 106 to the housing 101.

In the above embodiment, as illustrated in FIG. 6, the connecting portion 13 is bent 90 degrees into a U-shaped form. However, the connecting portion 13 does not have to be bent into a U-shaped form and may be bent into any shape, such as an L-shaped form, a V-shaped form, or a Z-shaped form. Further, the connecting portion 13 may be bent by an angle of 90 degrees or greater to have a stepped form or the like.

Figure 13:
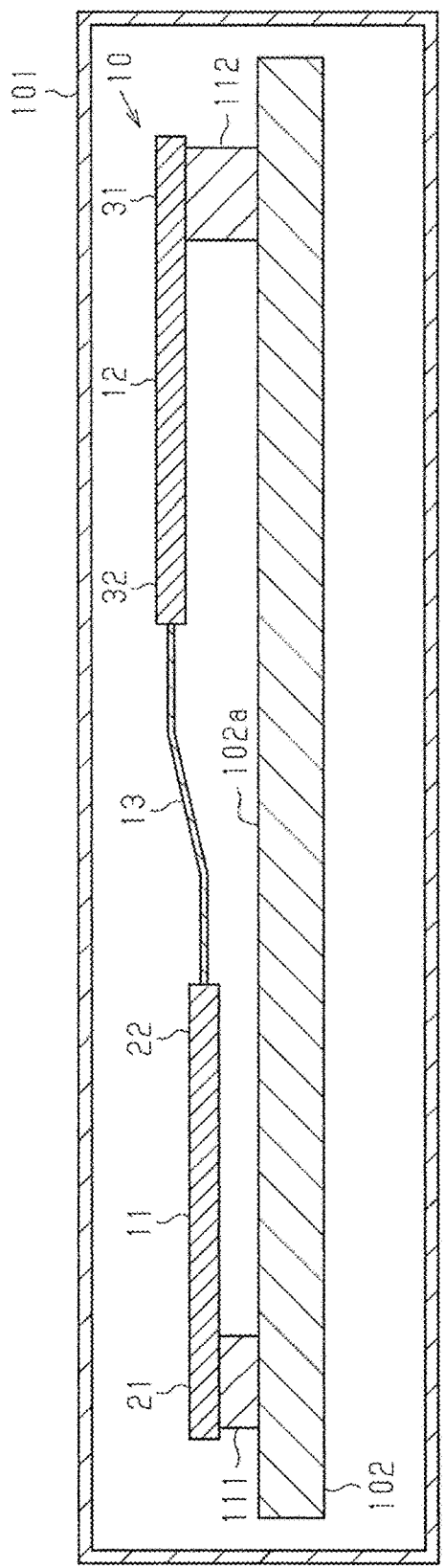

For example, as illustrated in FIG. 13, when the heat-generating components 111 and 112 have different heights and are mounted on the upper surface 102a of the wiring substrate 102, the connecting portion 13 may be stepped by bending the connecting portion 13 at an angle of 90 degrees or greater. By bending and shaping the connecting portion 13 in such a manner, the evaporators 21 and 31 of the heat pipe 10 are allowed to be fixed to the upper surfaces of the heat-generating components 111 and 112 in contact with the upper surfaces. This further ensures that the heat pipe 10 is kept in position. Further, the connecting portion 13 increases the surface area of the portion from where the heat pipe 10 dissipates heat as compared with when dissipating heat from only the two separate condensers 22 and 32. This improves the heat dissipating efficiency of the condensers 22 and 32.

The above embodiment and modified examples may be implemented in combination.

Clause

This disclosure further encompasses the following embodiment.

1. A method for manufacturing a loop heat pipe, the method including:

etching each of a plurality of metal layers to pattern and shape the plurality of metal layers into a first evaporator, a first condenser, a first liquid tube, and a first vapor tube of a first heat pipe portion and a second evaporator, a second condenser, a second liquid tube, and a second vapor tube of a second heat pipe portion; and stacking the plurality of metal layers to form the first heat pipe portion, the second heat pipe portion, and a connecting portion that connects the first condenser and the second condenser.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A loop heat pipe comprising:
a first heat pipe portion including
a first evaporator that vaporizes working fluid,
a first condenser that liquefies the working fluid vaporized by the first evaporator,
a first vapor tube from which the working fluid vaporized by the first evaporator flows into the first condenser, and
a first liquid tube from which the working fluid liquefied by the first condenser flows into the first evaporator;
a second heat pipe portion including
a second evaporator that vaporizes working fluid,
a second condenser that liquefies the working fluid vaporized by the second evaporator,
a second vapor tube from which the working fluid vaporized by the second evaporator flows into the second condenser, and
a second liquid tube from which the working fluid liquefied by the second condenser flows into the second evaporator; and
a connecting portion that connects the first condenser and the second condenser, wherein
the first heat pipe portion and the second heat pipe portion are formed by stacking a plurality of metal layers, and
the connecting portion is formed by at least one of the plurality of metal layers.

2. The loop heat pipe according to claim 1, wherein the connecting portion is adjacent to the first condenser and the second condenser.

3. The loop heat pipe according to claim 1, wherein:
the plurality of metal layers include
an uppermost metal layer including an upper surface of the first heat pipe portion and an upper surface of the second heat pipe portion,
a lowermost metal layer including a lower surface of the first heat pipe portion and a lower surface of the second heat pipe portion, and
one or more intermediate metal layers located between the uppermost metal layer and the lowermost metal layer; and
the connecting portion is formed by at least one of the one or more intermediate metal layers.

4. The loop heat pipe according to claim 1, wherein
the at least one of the plurality of metal layers forming the connecting portion is less in number than the plurality of metal layers, and
at least one of the plurality of metal layers excluding the at least one of the plurality of metal layers forming the connecting portion extends toward a middle part of the connecting portion to increase at least one of a surface area of the first condenser and a surface area of the second condenser.

5. The loop heat pipe according to claim 1, wherein the connecting portion includes at least one groove.

6. The loop heat pipe according to claim 5, wherein the at least one groove is located at a bending position of the connecting portion so that the first heat pipe portion and the second heat pipe portion are arranged in parallel when the connecting portion is bent.

7. An electronic device comprising:
a first heat-generating component mounted on an upper surface of a wiring substrate;
a second heat-generating component mounted on a lower surface of the wiring substrate; and
a loop heat pipe that cools the first heat-generating component and the second heat-generating component, wherein the loop heat pipe includes
a first heat pipe portion including
a first evaporator that vaporizes working fluid with heat of the first heat-generating component,
a first condenser that liquefies the working fluid vaporized by the first evaporator,
a first vapor tube from which the working fluid vaporized by the first evaporator flows into the first condenser, and
a first liquid tube from which the working fluid liquefied by the first condenser flows into the first evaporator,
a second heat pipe portion including
a second evaporator that vaporizes working fluid with heat of the second heat-generating component,
a second condenser that liquefies the working fluid vaporized by the second evaporator,
a second vapor tube from which the working fluid vaporized by the second evaporator flows into the second condenser, and
a second liquid tube from which the working fluid liquefied by the second condenser flows into the second evaporator, and
a connecting portion that connects the first condenser and the second condenser wherein
the first heat pipe portion and the second heat pipe portion are formed by stacking a plurality of metal layers, and
the connecting portion is formed by at least one of the plurality of metal layers.

8. The electronic device according to claim 7, further comprising a joining member that fixes the connecting portion to a side surface of the wiring substrate.

9. The electronic device according to claim 7, further comprising:
a heat sink; and
a housing accommodating the wiring substrate, the first heat-generating component, the second heat-generating component, the loop heat pipe, and the heat sink,
wherein the heat sink is connected to an inner surface of the housing and the connecting portion.

10. An electronic device comprising:
a first heat-generating component and a second heat-generating component that are mounted on an upper surface of a wiring substrate; and
a loop heat pipe that cools the first heat-generating component and the second heat-generating component, wherein the loop heat pipe includes
a first heat pipe portion including
a first evaporator that vaporizes working fluid with heat of the first heat-generating component,
a first condenser that liquefies the working fluid vaporized by the first evaporator,
a first vapor tube from which the working fluid vaporized by the first evaporator flows into the first condenser, and
a first liquid tube from which the working fluid liquefied by the first condenser flows into the first evaporator,
a second heat pipe portion including
a second evaporator that vaporizes working fluid with heat of the second heat-generating component,
a second condenser that liquefies the working fluid vaporized by the second evaporator,
a second vapor tube from which the working fluid vaporized by the second evaporator flows into the second condenser, and
a second liquid tube from which the working fluid liquefied by the second condenser flows into the second evaporator, and
a connecting portion that connects the first condenser and the second condenser wherein
the first heat pipe portion and the second heat pipe portion are formed by stacking a plurality of metal layers, and
the connecting portion is formed by at least one of the plurality of metal layers.

* * * * *